United States Patent
Jung

(10) Patent No.: US 12,426,639 B2
(45) Date of Patent: Sep. 30, 2025

(54) AEROSOL-GENERATING DEVICE AND OPERATING METHOD THEREOF

(71) Applicant: KT&G CORPORATION, Daejeon (KR)

(72) Inventor: Hyung Jin Jung, Seoul (KR)

(73) Assignee: KT&G CORPORATION, Daejeon (KR)

( * ) Notice: Subject to any disclaimer, the term of this patent is extended or adjusted under 35 U.S.C. 154(b) by 1227 days.

(21) Appl. No.: 17/278,980

(22) PCT Filed: Dec. 10, 2020

(86) PCT No.: PCT/KR2020/018109
§ 371 (c)(1),
(2) Date: Mar. 23, 2021

(87) PCT Pub. No.: WO2021/157841
PCT Pub. Date: Aug. 12, 2021

(65) Prior Publication Data
US 2022/0400768 A1    Dec. 22, 2022

(30) Foreign Application Priority Data

Feb. 7, 2020    (KR) .................. 10-2020-0015167

(51) Int. Cl.
*A24F 40/51*    (2020.01)
*A24D 1/20*    (2020.01)
(Continued)

(52) U.S. Cl.
CPC ............... *A24F 40/51* (2020.01); *A24D 1/20* (2020.01); *A24F 40/10* (2020.01); *A24F 40/20* (2020.01);
(Continued)

(58) Field of Classification Search
CPC .......... A24F 40/51; A24F 40/10; A24F 40/20; A24F 40/42; A24F 40/53; A24F 40/57;
(Continued)

(56) References Cited

U.S. PATENT DOCUMENTS 10,159,283 B2    12/2018    Mironov
10,463,080 B2    11/2019    Mironov
(Continued)

FOREIGN PATENT DOCUMENTS

CA    3100998 A1 *    7/2020    ............. A24F 40/20
CN    107802038 A    3/2018
(Continued)

OTHER PUBLICATIONS

Office Action dated Apr. 26, 2023 from the Chinese Patent Office in Application No. 202080006442.0.
(Continued)

*Primary Examiner* — Travis S Chambers
(74) *Attorney, Agent, or Firm* — Sughrue Mion, PLLC

(57) ABSTRACT

An aerosol-generating device and a controlling method thereof are provided. The aerosol-generating device may include a heating chamber configured to receive an aerosol-generating article, a heater configured to heat the aerosol-generating article in the heating chamber, an inductance sensor configured to measure an inductance value of a coil, a capacitance sensor configured to measure a capacitance value of a capacitor, and a controller configured to detect whether the aerosol-generating article is inserted based on the inductance value of the coil and the capacitance value of the capacitor.

13 Claims, 5 Drawing Sheets

(51) Int. Cl.
   *A24F 40/10* (2020.01)
   *A24F 40/20* (2020.01)
   *A24F 40/42* (2020.01)
   *A24F 40/53* (2020.01)
   *A24F 40/57* (2020.01)
   *G01R 27/26* (2006.01)
(52) U.S. Cl.
   CPC .............. *A24F 40/42* (2020.01); *A24F 40/53* (2020.01); *A24F 40/57* (2020.01); *G01R 27/2605* (2013.01); *G01R 27/2611* (2013.01)
(58) Field of Classification Search
   CPC ........... A24F 40/40; A24F 40/50; A24D 1/20; G01R 27/2605; G01R 27/2611; B29L 2031/06; B29C 70/205; B29C 70/86; B63B 73/20; B63B 73/50; B63B 2231/00; B63B 25/24
   See application file for complete search history.

(56) References Cited

U.S. PATENT DOCUMENTS

| | | | |
|---|---|---|---|
| 10,687,553 | B2 | 6/2020 | Kaufman et al. |
| 2004/0004133 | A1 | 1/2004 | Ivri et al. |
| 2006/0196518 | A1 | 9/2006 | Hon |
| 2019/0386526 | A1 | 12/2019 | Grassl et al. |
| 2020/0154772 | A1 | 5/2020 | Lim et al. |
| 2023/0301362 | A1 | 9/2023 | Kaufman et al. |

FOREIGN PATENT DOCUMENTS

| | | | | |
|---|---|---|---|---|
| CN | 209498588 | U | 10/2019 | |
| EP | 2 399 636 | A1 | 12/2011 | |
| JP | 2017-510270 | A | 4/2017 | |
| KR | 10-1971169 | B1 | 10/2016 | |
| KR | 10-2017-0007262 | A | 1/2017 | |
| WO | WO-2013171221 | A1 * | 11/2013 | ............. A24F 40/40 |
| WO | 2015/082560 | A1 | 6/2015 | |
| WO | 2016/005602 | A1 | 1/2016 | |
| WO | WO-2017001819 | A1 * | 1/2017 | ........... A24B 15/167 |
| WO | 2017/085242 | A1 | 5/2017 | |
| WO | 2018/190590 | A2 | 10/2018 | |
| WO | 2018178113 | A2 | 10/2018 | |
| WO | 2019/185746 | A1 | 10/2019 | |
| WO | 2019197170 | A1 | 10/2019 | |

OTHER PUBLICATIONS

International Search Report dated Mar. 30, 2021, from the International Application No. PCT/KR2020018109.

Japanese Office Action dated Aug. 1, 2023 in Application No. 2021-532327.

Extended European Search Report issued Nov. 30, 2021 in European Application No. 20859674.2.

Japanese Office Action dated Jul. 30, 2024 in application No. 2021-532327.

* cited by examiner

[Figure 1]
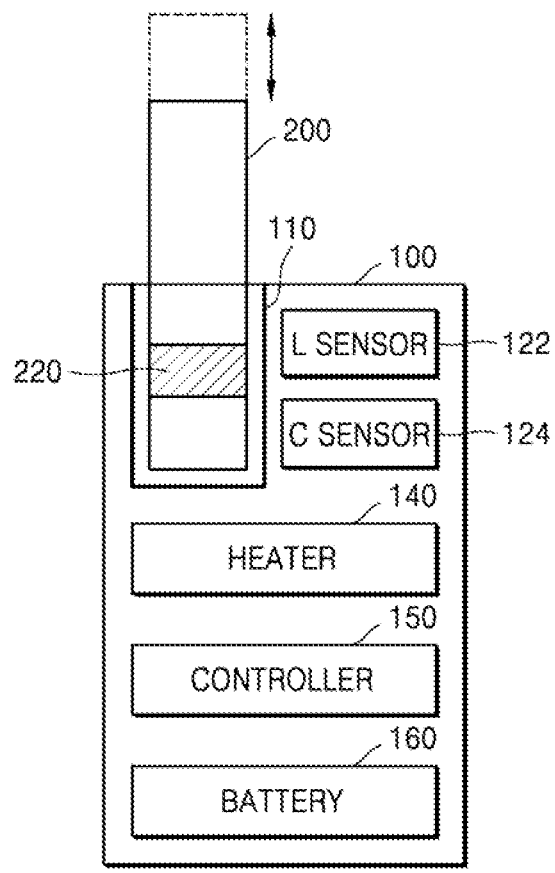

[Figure 2]
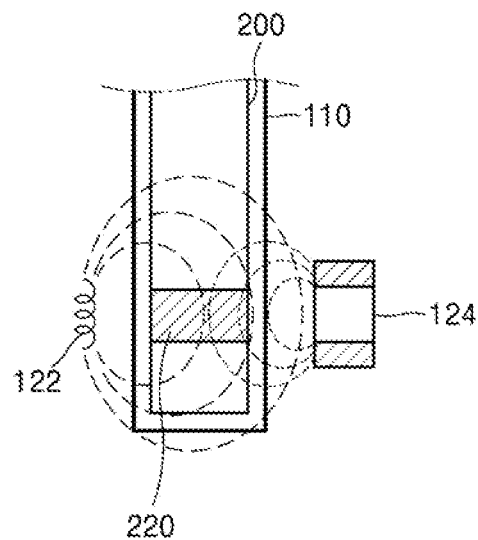
[Figure 3]
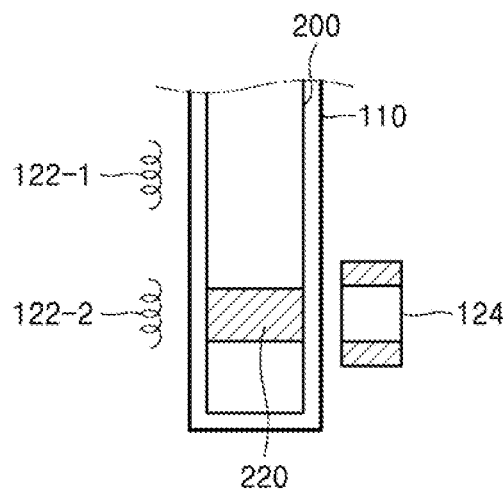

[Figure 4]
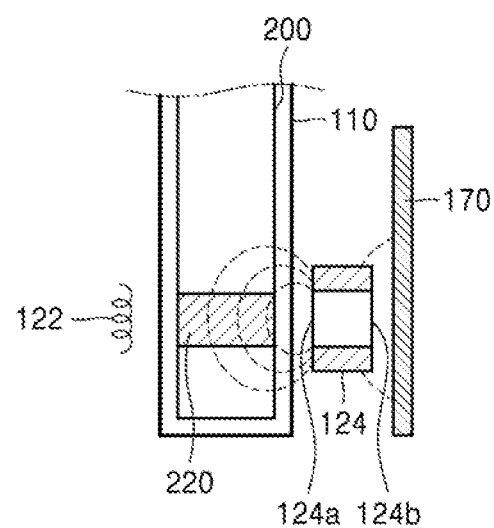

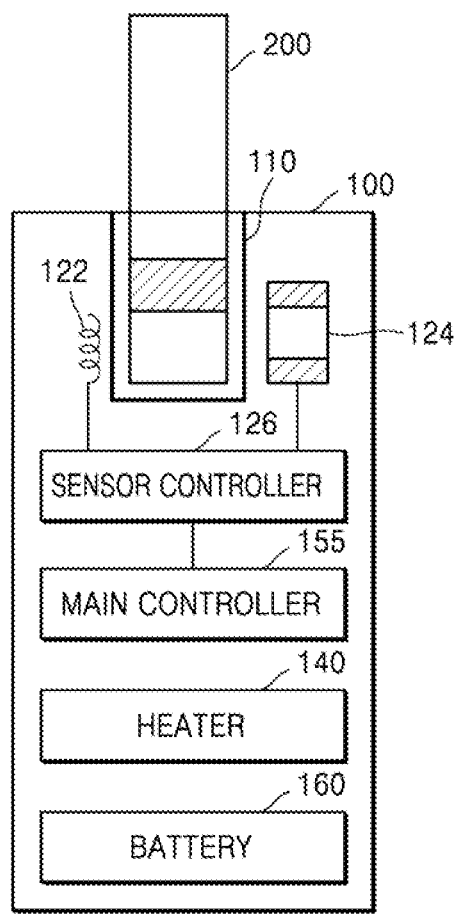
[Figure 5]

[Figure 6]
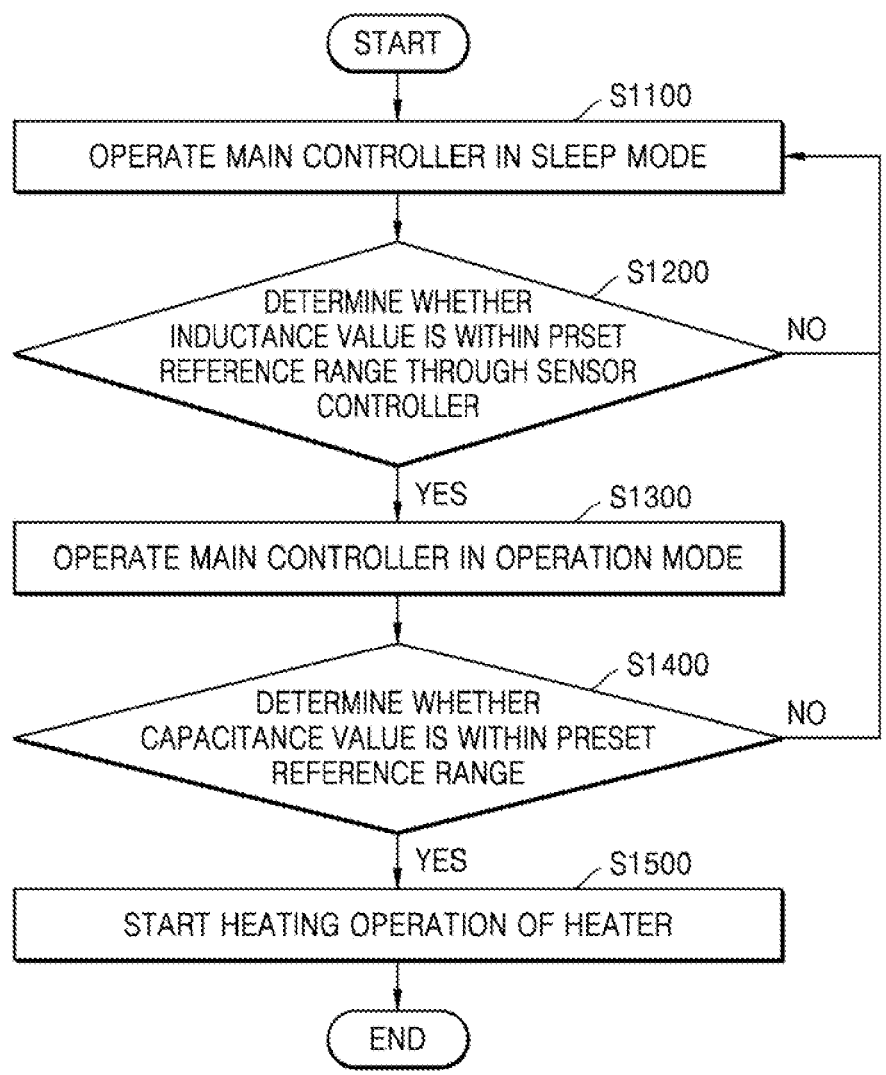

AEROSOL-GENERATING DEVICE AND OPERATING METHOD THEREOF

TECHNICAL FIELD

The disclosure relates to an aerosol-generating device and an operating method thereof.

BACKGROUND ART

Recently, the demand for alternative methods to overcome the disadvantages of traditional cigarettes has increased. For example, there is growing demand for an aerosol-generating device which generates aerosol by heating an aerosol-generating material in cigarettes, rather than by combusting cigarettes. Accordingly, research on a heating-type cigarette or a heating-type aerosol-generating device has been actively conducted.

Conventionally, an insertion of a cigarette into an aerosol-generating device was detected based on an amount of change in inductance. However, since such a cigarette detection method depends only on the amount of change in inductance, there is a limitation in that an external ferromagnetic material may be mistaken for a cigarette due to a change in inductance caused by the ferromagnetic material outside the aerosol-generating device. For this reason, an unintended heating operation may be caused due to false detection and malfunction, and there is a high possibility that an accident may occur due to such false detection.

DISCLOSURE

Technical Problem

An object of the present invention is to provide an aerosol-generating device for detecting whether a cigarette is inserted into the aerosol-generating device and an operating method thereof based on a combination of an inductance change amount and a capacitance change amount, by placing a material having both permeability and permittivity in a cigarette.

The problem to be solved by the present invention is not limited to the above-described problems, and other problems that are not mentioned above will be clearly understood by those of ordinary skill in the art from the present disclosure.

Technical Solution

According to an embodiment, an aerosol-generating device may be provided, the aerosol-generating device including: a heating chamber into which an aerosol-generating article is inserted, a heater configured to heat the aerosol-generating article in the heating chamber, an inductance sensor configured to measure an inductance value of a coil, a capacitance sensor configured to measure a capacitance value of a capacitor, and a controller configured to detect whether the aerosol-generating article is inserted based on the inductance value of the coil and the capacitance value of the capacitor.

Advantageous Effects

According to this invention, the aerosol-generating device can detect whether an external ferromagnetic material is in vicinity or a cigarette is inserted, by improving the conventional method of detecting cigarettes that depend only on the amount of change in inductance.

The effects of the present disclosure are not limited to the above-described effects, and effects not mentioned will be clearly understood by those of ordinary skill in the art from the present disclosure.

DESCRIPTION OF DRAWINGS

FIG. 1 is a block diagram showing a configuration of an aerosol-generating system according to an embodiment.

FIG. 2 is a conceptual diagram illustrating a sensing range of an inductance sensor and a sensing range of a capacitance sensor in an aerosol-generating device according to an exemplary embodiment.

FIG. 3 is a diagram of an aerosol-generating device including a plurality of inductance sensors according to an embodiment.

FIG. 4 is a diagram of an aerosol-generating device including a shield member according to an exemplary embodiment.

FIG. 5 is a block diagram of an aerosol-generating device including a sensor assembly in which an inductance sensor and a capacitance sensor are integrated according to an exemplary embodiment.

FIG. 6 is a flowchart illustrating an operating method of an aerosol-generating device.

BEST MODE

According to an embodiment, an aerosol-generating device may include: a heating chamber configured to receive an aerosol-generating article, a heater configured to heat the aerosol-generating article in the heating chamber, an inductance sensor configured to measure an inductance value of a coil, a capacitance sensor configured to measure a capacitance value of a capacitor, and a controller configured to detect whether the aerosol-generating article is inserted based on the inductance value of the coil and the capacitance value of the capacitor.

A detection range of the inductance sensor and a detection range of the capacitance sensor may be set differently.

*17The detection range of the inductance sensor may be set to be wider than the detection range of the capacitance sensor.

The controller may detect that the aerosol-generating article is inserted into the heating chamber based on the inductance value being greater than or equal to a first reference value and the capacitance value being greater than or equal to a second reference value.

One side of the capacitance sensor faces the heating chamber, and the aerosol-generating device may further include a shielding member placed on the other side opposite to the one side of the capacitance sensor.

The marker may be placed on one side of the aerosol-generating article, and the second inductance sensor may be positioned adjacent to the position of the marker of the aerosol-generating article inserted into the heating chamber.

The marker may have a permeability changing the inductance of the coil and a permittivity changing the capacitance value of the capacitor.

The aerosol-generating device may include a sensor assembly including the coil, the capacitor, and a sensor controller configured to receive the inductance value from the coil and the capacitance value from the capacitor.

The controller may include a main controller configured to operate in a sleep mode in which an operation of the heater is controlled to be deactivated and in an operation mode in which the operation of the heater is controlled to be activated, the sensor assembly may wake up the main controller from the sleep mode to the operation mode based on the inductance value, and the main controller may detect whether the aerosol-generating article is inserted based on the capacitance value.

The aerosol-generating article may be in a form of a cigarette extending in one direction, and the marker may be placed at one end of the aerosol-generating article.

The aerosol-generating article may be a cartridge including a liquid aerosol-generating material.

According to another embodiment, an operating method of an aerosol-generating device may include: measuring an inductance value of a coil that changes according to movement of an aerosol-generating article including a marker, by an inductance sensor including the coil; measuring a capacitance value of a capacitor that changes according to the movement of the aerosol-generating article including the marker, by a capacitance sensor including the capacitor; detecting whether the aerosol-generating article is inserted into a heating chamber based on the inductance value and the capacitance value; and heating the aerosol-generating article inserted into the heating chamber using a heater.

According to another embodiment, an operating method of an aerosol-generating device may include: operating a main controller in a sleep mode, operating the main controller in an operation mode based on an inductance value of a coil from a sensor assembly that changes as an aerosol-generating article including a marker approaches; and detecting, by the main controller, whether an aerosol-generating article is inserted into the heating chamber based on the capacitance value of a capacitor measured through the sensor assembly.

According to another embodiment, an aerosol-generating system may be provided, the aerosol-generating system including: an aerosol-generating article including an aerosol-generating material and a marker; and an aerosol-generating-device including a heating chamber into which an aerosol-generating article is inserted, a heater configured to heat the aerosol-generating article in the heating chamber, an inductance sensor measuring an inductance value of a coil, a capacitance sensor measuring a capacitance value of a capacitor, and a controller configured to detect whether the aerosol-generating article is inserted based on the inductance value of the coil and the capacitance value of the capacitor.

MODE FOR INVENTION

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that when an element is referred to as being "over," "above," "on," "connected to" or "coupled to" another element, it can be directly over, above, on, connected or coupled to the other element or intervening elements may be present. In contrast, when an element is referred to as being "directly over," "directly above," "directly on," "directly connected to" or "directly coupled to" another element, there are no intervening elements present.

With respect to the terms used to describe the various embodiments, general terms which are currently and widely used are selected in consideration of functions of structural elements in the various embodiments of the present disclosure. However, meanings of the terms can be changed according to the intention of one of ordinary skill in the art, judicial precedents, an emergence of new technology, and the like. In addition, in certain cases, a term which is not commonly used can be selected. In such a case, the meaning of the term will be described in detail at the corresponding portion in the description of the present disclosure. Therefore, the terms used in the various embodiments of the present disclosure should be defined based on the meanings of the terms and in the context of the descriptions provided herein.

In addition, unless explicitly indicated otherwise, the word "comprise" and variations such as "comprises" or "comprising" will be understood to imply the inclusion of stated elements but not the exclusion of any other elements. In addition, the terms "-er", "-or", and "module" may refer to units for processing at least one function and operation and can be implemented by hardware components or software components and combinations thereof.

Hereinafter, the present disclosure will now be described more detail with reference to the accompanying drawings, in which exemplary embodiments of the present disclosure are shown such that one of ordinary skill in the art may easily understand and practice the present disclosure. The disclosure may, however, be embodied in many different forms and should not be construed as being limited to the embodiments set forth herein.

Throughout the disclosure, an aerosol-generating device may be a device that generates an aerosol by using an aerosol-generating material to generate an aerosol that may be directly inhaled into the user's lungs through the user's mouth. For example, the aerosol-generating device may be a holder.

Throughout the disclosure, the term "puff" may refer to the user's inhalation of certain aerosol by a user, and the term "inhalation" may refer to an act of breathing by a user through the user's oral cavity, nasal cavity, or lungs.

Hereinafter, embodiments of the present disclosure will be described in detail with reference to the accompanying drawings.

FIG. 1 is a block diagram of an aerosol-generating system according to an embodiment.

Referring to FIG. 1, an aerosol-generating system may include an aerosol-generating device 100 and an aerosol-generating article 200. In the aerosol-generating system shown in FIG. 1, only certain components the embodiments are shown. However, it may be understood by those of ordinary skill in the art related to the present embodiment that components other than the components shown in FIG. 1 may be further included in the aerosol generation system.

The aerosol-generating device 100 may vaporize an aerosol-generating material included in the aerosol-generating article 200 and generate an aerosol, by heating the aerosol-generating article 200. The generated aerosol may be inhaled a user. The aerosol-generating device 100 may include a heating chamber 110, a heater 140, an inductance sensor 122, a capacitance sensor 124, a controller 150, a battery, and the like.

The heating chamber 110 may be a space in which the aerosol-generating article 200 is inserted and the inserted aerosol-generating article 200 is heated by the heater 140. The heating chamber 110 may be an empty space formed in a housing constituting the exterior of the aerosol-generating device 100. The aerosol-generating material may be inserted into the heating chamber 110 or be removed from the heating chamber 110, through the opening formed in the housing.

The heating chamber 110 may be fabricated in a shape corresponding to the shape of the aerosol-generating article 200. For example, when the aerosol-generating article 200 has an elongated shape extending in one direction, the heating chamber 110 may have a cylindrical shape in which an empty space extending in one direction is formed. For another example, when the aerosol-generating article 200 is a rectangular parallelepiped cartridge, the heating chamber 110 may be an empty rectangular parallelepiped space to accommodate the cartridge.

According to an embodiment, the heating chamber 110 may include an insulating material to prevent heat transferred from the heater 140 from being discharged to the outside.

The heater 140 may heat the aerosol-generating article 200 inserted in the heating chamber 110. The heater 140 is heated by power supplied from the battery, thereby heating and vaporizing the aerosol-generating material.

According to an embodiment, when the aerosol-generating article 200 has a cigarette form, at least a part of the cigarette including the aerosol-generating material may be inserted into the aerosol-generating device 100. The heater 140 may be positioned inside or outside the cigarette to heat the aerosol-generating material.

According to an embodiment, when the aerosol-generating article 200 is a cartridge type, the aerosol-generating material may be stored in a storage unit (not shown) of a cartridge (not shown). The storage unit may deliver the stored aerosol-generating material to an atomizer (not shown) along a capillary wick using surface tension. The heater 140 may be provided in the atomizer to heat the aerosol-generating material.

The heater 140 is not limited and may include all heaters which may be heated to a desired temperature. The desired temperature may be pre-set in the aerosol-generating device 100 or may be set to a temperature desired by a user.

The heater 140 may include an electro-resistive heater. For example, the heater 140 may include an electrically conductive track, and the heater 140 may be heated when currents flow through the electrically conductive track.

The heater 140 may include an induction heater. Specifically, the heater 140 may include an electrically conductive coil for heating an aerosol-generating article in an induction heating method, and the aerosol-generating article may include a susceptor which may be heated by the induction heater 140.

The inductance sensor 122 may include a coil and a sensor controller 126 capable of measuring an inductance value of the coil. According to Faraday's law, when the magnetic field around a coil through which a current flows changes, the characteristics of the current flowing through the coil may change.

As the aerosol-generating article 200 is inserted into or removed from the heating chamber 110, the current flowing through the coil may induce eddy currents in a marker 220 of the aerosol-generating article 200. The eddy current flowing through the marker 220 may change characteristics of the current such as the frequency of the current flowing through the coil and the inductance value of the coil through mutual induction with the coil.

The inductance sensor 122 may measure a characteristic value of a changing current. For example, the characteristics of the current flowing through the coil may include a frequency value of an AC current, a value of a current, a voltage value, an inductance value, an effective resistance, an impedance value, and the like. The inductance sensor 122 may further include a frequency measuring element, a rectifier, an amplifier, and an oscillating circuit for generating electric vibration.

When the inductance sensor 122 measures the inductance value of the coil, it means that it includes measuring any one of the characteristics of the current flowing through the coil and the obtaining inductance value through calculation from the measured characteristic value of the current.

The inductance L of the coil may be obtained through Equation 1, for example.

$$L = \frac{1}{(2\pi * Fsen)^C} \quad \text{(Equation 1)}$$

Here, Fsen may refer to the frequency of the current flowing through the coil, and C may refer to the capacitance of the coil. The capacitance (C) of the coil may be a value in consideration of the capacitance and parasitic capacitance of the coil itself.

The inductance sensor 122 may transmit the measured inductance value to the controller 150, and the controller 150 may determine whether an aerosol-generating material is inserted based on the inductance value.

The capacitance sensor 124 may include a capacitor and a sensor controller 126 that measures a capacitance value of the capacitor.

The capacitance sensor 124 may include two electrodes facing each other. A dielectric may be placed between the two electrodes. Movement of the marker 220 as the aerosol-generating material is inserted into and removed from the heating chamber 110 may affect an electric field between two electrodes, and a capacitance value between the two electrodes may change. The capacitance sensor 124 may measure the capacitance value and transmit it to the controller 150. The controller 150 may determine whether the aerosol-generating material is inserted based on the capacitance value.

The controller 150 controls the overall operation of the aerosol-generating device 100. Specifically, the controller 150 controls the operation of not only the battery 160, the heater 140, the inductance sensor 122, and the capacitance sensor 124, but also other components included in the aerosol-generating device 100.

The controller 150 may receive an inductance value of the coil from the inductance sensor 122 and detect whether the aerosol-generating article 200 is inserted based on the inductance value. For example, when the inductance value sensed is greater than or equal to a preset threshold, the controller 150 may determine that the aerosol-generating article 200 is inserted in the heating chamber 110. The controller 150 may pre-store in a memory an inductance value in a state in which the aerosol-generating article 200 is inserted and an inductance value in a state in which the aerosol-generating article 200 is removed.

The controller 150 may receive a capacitance value of the capacitor from the capacitance sensor 124 and detect whether the aerosol-generating article 200 is inserted based on the capacitance value. For example, when the capacitance value detected is greater than or equal to a preset threshold, the controller 150 may determine that the aerosol-generating article 200 is inserted in the heating chamber 110. The controller 150 may pre-store in a memory a capacitance value in a state in which the aerosol-generating article 200 is inserted and a capacitance value in a state in which the aerosol-generating article 200 is removed.

According to an embodiment, the controller 150 may determine that the aerosol-generating article 200 is inserted by a combination of an inductance value measured from the inductance sensor 122 and a capacitance value measured from the capacitance sensor 124. For example, when both the first condition related to the inductance value and the second condition related to the capacitance value are satisfied, the controller 150 may determine that the aerosol-generating article 200 is inserted. This will be described in more detail later with reference to FIG. 2.

When it is determined that the aerosol-generating article 200 is inserted in the heating chamber 110, the controller 150 may supply power to the heater 140 from the battery, and heat the aerosol-generating article 200 using the heater 140. When it is determined that the aerosol-generating article 200 has been removed from the heating chamber 110, the controller 150 may stop supplying power to the heater 140 from the battery 160.

The controller 150 may include at least one processor. A processor can be implemented as an array of a plurality of logic gates or can be implemented as a combination of a microprocessor and a memory in which a program executable in the microprocessor is stored. It will be understood by one of ordinary skill in the art that the processor can be implemented in other forms of hardware.

The battery supplies power used to operate the aerosol-generating device 100. For example, the battery may supply power so that the heater 140 may be heated, and may supply power necessary for the controller 150 to operate. The battery may supply power to the inductance sensor 122 and the capacitance sensor 124. In addition, the battery may supply power required to operate a display, a sensor, a motor, etc. included in the aerosol-generating device 100.

According to an embodiment, the battery may be electrically connected to an adapter, and the adapter may convert a direct current output from the battery into an alternating current and output it.

Also, the aerosol-generating device 100 may further include components in addition to the battery 160, the heater 140, the inductance sensor 122, and the capacitance sensor 124. For example, the aerosol-generating device 100 may include a display capable of outputting visual information and/or a motor for outputting tactile information, a charging terminal for charging a battery, and the like. The motor may notify, for example, through vibration that heating of the heater 140 is completed. For example, the aerosol-generating device 100 may include an LED, and may display an operating state of the heater 140 through the LED.

In addition, the aerosol-generating device 100 may include at least one sensor (a puff detection sensor, a temperature detection sensor, a cigarette insertion detection sensor, etc.). The controller 150 may check the presence or absence of puffs and the strength of the puffs of the user through the puff detection sensor, and may count the number of puffs.

In addition, the aerosol-generating device 100 may include an input unit (not shown). As a user input is received through the input unit, the operation of the aerosol-generating device 100 may be controlled.

The aerosol-generating article 200 may include an aerosol-generating material and a marker 220. The aerosol-generating material may be heated by the heater 140 of the aerosol-generating device 100 and vaporized to generate an aerosol.

For example, the aerosol-generating material may include at least one of glycerin, propylene glycol, ethylene glycol, dipropylene glycol, diethylene glycol, triethylene glycol, tetraethylene glycol, and oleyl alcohol, but it is not limited thereto. Also, the aerosol-generating material may include other additives, such as flavors, a wetting agent, and/or organic acid. Also, the aerosol-generating material may include a flavored liquid, such as menthol or a moisturizer, which is injected into the aerosol-generating material.

The marker 220 is a material having magnetic and conductive properties, and has a specific magnetic permeability and a specific permittivity. Accordingly, the inductance value of the coil and the capacitance value of the capacitor may change according to the presence of the marker 220 and the movement of the marker 220. The marker 220 may be, for example, a metal material including aluminum, nickel, and iron. The marker 220 may be manufactured in the form of ink, tape, band, and paper.

According to an embodiment, the aerosol-generating article 200 may have a cigarette form extending in one direction. In this case, the aerosol-generating article 200 may include a tobacco rod including the aerosol-generating material, a cooling rod for cooling the aerosol, and a filter rod for filtering impurities. When the aerosol-generating article 200 has a cigarette form, the marker 220 may be placed at one end of the aerosol-generating article 200. One end of the aerosol-generating article 200 on which the marker 220 is placed may be inserted into the heating chamber 110.

According to another embodiment, the aerosol-generating article 200 may be a cartridge type including a liquid aerosol-generating material. The aerosol-generating article 200 may include a storage in which a liquid aerosol-generating material is stored, a wick for transporting the aerosol-generating material from the storage, a heater 140 surrounding the wick and heating the aerosol-generating material absorbed in the wick, and a contact terminal connecting the heater 140 and the battery 160.

According to an embodiment, the types of the aerosol-generating article 200 may vary, and each aerosol-generating article 200 may include a marker 220 of a preset type. Depending on the type of the marker 220, the inductance value and the capacitance value changed by the marker 220 may be different. The aerosol-generating device 100 may store table information matching the type of the marker 220 and the type of the aerosol-generating article 200 in a memory, and the aerosol-generating device 100 may determine the type of the inserted aerosol-generating article 200 based on the inductance value and the capacitance value that are changed by the marker 220.

FIG. 2 is a conceptual diagram illustrating a sensing range of the inductance sensor 122 and a sensing range of the capacitance sensor 124 of the aerosol-generating device 100 according to an exemplary embodiment.

Referring to FIG. 2, a detection range for the marker 220 of the inductance sensor 122 may be set differently according to the magnitude of the magnetic field formed in the coil of the inductance sensor 122. That is, the detection range for the marker 220 of the inductance sensor 122 may be set according to the magnitude of the current applied to the coil of the inductance sensor 122. The sensor controller 126 of the inductance sensor 122 or the controller 150 of the aerosol-generating device 100 may set a reference value of an inductance value for recognizing that the marker 220 exists within a preset distance, and the detection range for the marker 220 of the inductance sensor 122 may be set according to the reference value of the inductance value.

Depending on the magnitude of the electric field formed in the capacitor, a detection range for the marker 220 of the capacitors sensor may be set differently. That is, the detection range for the marker 220 of the capacitance sensor 124 may be set according to a potential difference between two electrodes of the capacitance sensor 124 and a magnitude of the capacitance. The sensor controller 126 of the capacitance sensor 124 or the controller 150 of the aerosol-generating device 100 may set a reference value of a capacitance value for recognizing that the marker 220 exists within a preset distance, and the detection range for the marker 220 of the capacitance sensor 124 may be set according to the reference value of the capacitance value.

The two electrodes of the capacitance sensor 124 may be spaced apart along a first direction. The first direction may be a direction in which the aerosol-generating article 200 and the heating chamber 110 extend. An electric field may be formed in the capacitor along the first direction.

The detection range of the inductance sensor 122 to sense the marker 220 and the detection range of the capacitance sensor 124 to sense the marker 220 may be different. Accordingly, there may be a region in which the detection range of the inductance sensor 122 and the detection range of the capacitance sensor 124 overlap each other. Also, there may be a region where the detection range of the inductance sensor 122 and the detection range of the capacitance sensor 124 do not overlap each other.

The aerosol-generating device 100 may detect whether the aerosol-generating article 200 is inserted by arranging the heating chamber 110 in a region where the detection range of the inductance sensor 122 and the detection range of the capacitance sensor 124 overlap each other, and based on the inductance value and the capacitance value obtained from respective sensors. For example, the aerosol-generating device 100 may determine that the aerosol-generating article 200 is inserted when both a first condition related to the inductance value and a second condition related to the capacitance value are satisfied. The aerosol-generating device 100 may detect that the aerosol-generating article 200 is inserted when the inductance value is greater than or equal to the first reference value and the capacitance value is greater than or equal to the second reference value. Accordingly, the aerosol-generating device 100 may determine whether the aerosol-generating article 200 is inserted with high accuracy.

The detection range of the inductance sensor 122 to detect the marker 220 may be set to be wider than the detection range of the capacitance sensor 124 for the marker 220. For example, the detection range of the inductance sensor 122 for the marker 220 may be set to a region including not only the heating chamber 110, but also the exterior of the housing of the aerosol-generating device 100. The detection range of the capacitance sensor 124 for the marker 220 may be set to be an area inside the heating chamber 110.

For example, when the aerosol-generating device 100 determines whether the aerosol-generating article 200 is inserted based only on the inductance value received from the inductance sensor 122, the aerosol-generating device 100 may detect a change in the inductance value due to a ferromagnetic material in vicinity of the aerosol-generating device 100, and may erroneously determine the external ferromagnetic material as the aerosol-generating article 200.

Therefore, the aerosol-generating device 100 may improve the accuracy of detecting the aerosol-generating article 200 by detecting that the aerosol-generating article 200 is within a preset distance based on the inductance value measured by the inductance sensor 122 and detecting that the aerosol-generating article 200 is inserted into the heating chamber 110 based on the capacitance value measured by the capacitance sensor 124.

Further, the sensitivity at which the inductance sensor 122 detects the marker 220 and the sensitivity at which the capacitance sensor 124 detects the marker 220 may be set differently. In general, the capacitance sensor 124 may have a high sensitivity for measuring the capacitance value measured at the unit of femto farads (fF), and accordingly, the capacitance sensor 124 may have a high noise ratio.

Therefore, the aerosol-generating device 100 may first determine whether the first condition related to the inductance value measured by the inductance sensor 122 is satisfied, and determine whether the second condition related to the capacitance value measured by the capacitance sensor 124 is satisfied as a lower priority. That is, the aerosol-generating device determines whether the second condition related to the capacitance value is satisfied only when the first condition is satisfied. Accordingly, the aerosol-generating device 100 may solve the above-described problem due to a high noise ratio of the capacitance sensor 124 and improve accuracy.

FIG. 3 is a block diagram of an aerosol-generating device 100 including a plurality of inductance sensors 122 according to an exemplary embodiment.

Referring to FIG. 3, the aerosol-generating device 100 may include a plurality of inductance sensors 122. The plurality of inductance sensors 122 may be spaced apart from each other in a first direction. Here, the first direction may be a direction in which the aerosol-generating article 200 extends. In addition, the first direction may be a direction in which the aerosol-generating article 200 is inserted into the aerosol-generating device 100.

For example, when the aerosol-generating device 100 determines whether the aerosol-generating article 200 is inserted based on the inductance value measured by one inductance sensor 122, the inductance value may change due to the influence of an external environment such as a magnetic material close to the periphery of the inductance sensor 122. Therefore, in this case, there is a problem in that the reference value of the inductance value for determining whether the aerosol-generating article 200 is inserted needs to be corrected in real time.

In order to solve this problem, the aerosol-generating device 100 may determine whether the aerosol-generating article 200 is inserted based on the inductance values measured by the plurality of inductance sensors 122.

More specifically, when the aerosol-generating article 200 is inserted into the heating chamber 110, the inductance values measured by the plurality of inductance sensors 122 may be different depending on the position of the marker 220. The aerosol-generating device 100 may determine that the aerosol-generating article 200 is inserted based on a difference value between respective inductance values measured by each of the plurality of inductance sensors 122. Accordingly, the aerosol-generating device 100 may remove noise due to the influence of an external environment and improve accuracy.

According to an embodiment, the inductance sensor 122 may include a first inductance sensor 122-1 and a second inductance sensor 122-2 spaced apart from the first inductance sensor 122-1. When the aerosol-generating article 200 is inserted into the heating chamber 110, the marker 220 may be positioned adjacent to the position of the second inductance sensor 122-2. The first inductance sensor 122-1 and the second inductance sensor 122-2 may measure an inductance value changed by the marker 220. The change amount of the inductance value in the second inductance sensor 122-2 by the marker 220 may be greater than the change amount of the inductance value in the first inductance sensor 122-1.

When the difference between the inductance values measured by the first inductance sensor 122-1 and the second inductance sensor 122-2 is greater than a preset reference value, the controller 150 or the sensor controller 126 of the inductance sensor 122 may determine that the aerosol-generating article 200 is inserted.

Although not shown through FIG. 3, the aerosol-generating device 100 may include a plurality of capacitance sensors 124, and the plurality of capacitance sensors 124 may be spaced apart from each other in the first direction. The controller 150 may detect whether the aerosol-generating article 200 is inserted based on capacitance values measured by the plurality of capacitance sensors 124.

FIG. 4 is a block diagram of an aerosol-generating device 100 including a shielding member according to an exemplary embodiment.

Referring to FIG. 4, the aerosol-generating device 100 may include a shielding member to minimize the influence of an external environment, such as electronic devices, on the capacitance sensor 124.

The capacitance sensor 124 may detect the aerosol-generating article 200 being inserted into the heating chamber 110 by arranging one side 124a of the capacitance sensor 124 to face the heating chamber 110.

A shielding member may be placed on the other side 124b of the capacitance sensor 124. Various electronic devices including a memory, the battery 160 and the controller 150 may be placed on the other side 124b of the capacitance sensor 124, and the shielding member may be placed on the other side 124b between the capacitance sensor and various electronic devices. The shielding member may shield the other side 124b of the capacitance sensor 124 from the influence of an external electric field including electronic devices. Accordingly, the sensing range of the capacitance sensor 124 may be limited to the inside of the heating chamber 110, and accuracy may be improved.

The shielding member may be, for example, a conductive material such as aluminum and copper. Alternatively, the shielding member may be a carbon material such as carbon fiber, carbon nanotube (CNT), carbon black, graphene, or the like. Alternatively, the shielding member may be a polymer composite material or a material including carbon, ceramic, or metal added to the polymer composite material.

The shielding member may be, for example, a sheet metal, a mesh, or a form coated with an ionizing gas. The shielding member may be manufactured by, for example, sputtering, plating or spray coating.

Although not shown through FIG. 4, the aerosol-generating device 100 may include a shielding member placed on the other side of the inductance sensor 122 opposite to one side of the inductance sensors 122 facing the heating chamber 110. Accordingly, the inductance sensor 122 may be shielded from the influence of an external magnetic field such as an electronic device placed on the other side, and the detection range of the inductance sensor 122 may be limited to the inside of the heating chamber 110.

FIG. 5 is a block diagram of an aerosol-generating device 100 including a sensor assembly in which an inductance sensor 122 and a capacitance sensor 124 are integrated according to an exemplary embodiment.

Referring to FIG. 5, the aerosol-generating device 100 may include the sensor assembly including a coil configured to measure an inductance value, a capacitor configured to measure a capacitance value, and a sensor controller 126 configured to receive and process an inductance value and a capacitance value, and transmit the received and processed values to a main controller 155 of the aerosol-generating device 100.

The sensor controller 126 of the sensor assembly may be connected to the coil and the capacitor, and the sensor controller 126 may receive both the inductance value and the capacitance value.

As the sensor assembly includes one sensor controller 126, power may be saved compared to a case in which a plurality of sensor controllers 126 for coils and for capacitors are separately provided.

In addition, when a plurality of sensor controllers 126 for coils and sensor controllers 126 for capacitors are separately provided, a plurality of paths connecting the sensor controllers 126 to the main controller 155 must also be designed, thereby, complicating the packaging and increasing the size of the sensor.

On the other hand, as the sensor assembly uses one sensor controller 126, a coil and a capacitor located close to the heating chamber 110 are connected, thereby enabling simple and compact packaging.

According to an exemplary embodiment, the sensor controller 126 may separately include a port connected to the coil and a port connected to the capacitor. The sensor controller 126 may control each of the coil and the capacitor through the ports. The sensor controller 126 may block or ignore information transmission through any one of a port connected to the coil and a port connected to the capacitor.

The sensor controller 126 is connected to the main controller 155 and may transmit the inductance value measured through the coil and the capacitance value measured through the capacitor to the main controller 155. According to one or more embodiments, the sensor controller 126 may determine whether the inductance value or the capacitance value satisfies a preset condition, and may notify the main controller 155 whether the condition is satisfied. For example, when the inductance value is greater than or equal to a preset reference value, the sensor controller 126 may notify the main controller 155 that the inductance value is greater than or equal to the preset reference value.

The main controller 155 may control overall components of the aerosol-generating device 100. The main controller 155 may operate in a sleep mode driven with low power and in an operation mode capable of operating the heater 140.

The main controller 155 may disable some of the ports connected to various electronic devices to minimize power consumption in the sleep mode, and may prevent power consumption that may be generated through the port. For example, the main controller 155 may minimize power consumed to control the heater 140 by deactivating a port connected to the heater 140 in the sleep mode and limiting the operation of the heater 140.

The main controller 155 may activate ports connected to various electronic devices in an operation mode, and may control the overall operation of the aerosol-generating device 100. For example, the main controller 155 may activate the port connected to the heater 140 in the operation mode and control a heating operation of the heater 140.

The main controller 155 may deactivate the port connected to the heater 140 in the sleep mode, but maintain the port connected to the sensor controller 126 in an active state. When the main controller 155 detects that the aerosol-generating article 200 is inserted through the sensor controller 126, the main controller 155 may start operating in an operation mode, thereby activating the port connected to the heater 140, and controlling a heating operation of the heater 140.

FIG. 6 is a flowchart illustrating an operating method of the aerosol-generating device 100.

Referring to FIG. 6, the aerosol-generating device 100 may operate in a sleep mode and in an operation mode based on an inductance value and a capacitance value measured by the sensor assembly.

First, the main controller 155 of the aerosol-generating device 100 may operate in a sleep mode (S1100). As described above with reference to FIG. 5, the main controller 155 may disable ports connected to the electronic device for low power consumption in the sleep mode. However, the main controller 155 may activate a port connected to the sensor assembly.

The sensor controller 126 of the sensor assembly may determine whether the inductance value is within a preset reference range (S1200). The sensor controller 126 may determine whether the inductance value of the coil that changes as the aerosol-generating article 200 including the marker 220 approaches the heating chamber 110 and is within a preset reference range. The preset reference range of the inductance value is the range of the inductance value measured when the aerosol-generating article 200 approaches or is inserted into the heating chamber 110, and may be stored in advance in the sensor controller 126.

The sensor controller 126 may transmit a notification signal to the main controller 155 when the inductance value is within a preset reference range. When the inductance value is not within the preset reference range, the sensor assembly may not transmit the notification signal to the main controller 155, and the main controller 155 may maintain the sleep mode.

When receiving the notification signal from the sensor assembly, the main controller 155 may release the sleep mode and operate in the operation mode (S1300). The main controller 155 may activate ports connected to electronic devices in an operation mode, and may perform calculations and information processing using information received through the ports.

Thereafter, the aerosol-generating device 100 may determine whether the capacitance value is within a preset reference range (S1400). According to an embodiment, the main controller 155 operating in the operation mode may receive a capacitance value through the sensor controller 126 and determine whether the capacitance value is within a preset reference range. Alternatively, according to another embodiment, the sensor controller 126 may determine whether the capacitance value is within a preset reference range.

The preset reference range of the capacitance value is a range of the capacitance value measured when the aerosol-generating article 200 is inserted into the heating chamber 110, and may be stored in advance in the sensor controller 126 or the main controller 155.

When the capacitance value is not within the preset reference range, the main controller 155 may determine that the change in the inductance value has occurred due to an external magnetic body and that the aerosol-generating article 200 is not inserted, and may operate in the sleep mode after releasing the operation mode.

When the capacitance value is within a preset reference range, the main controller 155 may determine that the aerosol-generating article 200 is inserted into the heating chamber 110 and allow the heating operation of the heater 140. Accordingly, the aerosol-generating device 100 may improve the accuracy of detecting whether the aerosol-generating article 200 is inserted based on the combination of the inductance value and the capacitance value.

Further, the aerosol-generating device 100 heats the heater 140 only when the aerosol-generating article 200 is inserted, thereby preventing malfunction of the heater 140 and ensuring safety. In addition, the aerosol-generating device 100 may save standby power consumed by the main controller 155 by operating the main controller 155 in the sleep mode until the inductance value measured is within the reference range.

In addition, the aerosol-generating device 100 may quickly determine the approaching aerosol-generating article 200 by using the inductance measurement value of the inductance sensor 122 having a wide sensing range first, and may lower a noise ratio and improve accuracy by using the capacitance value of the capacitance sensor 124 with high sensitivity as a lower priority.

At least one of the components, elements, modules or units (collectively "components" in this paragraph) represented by a block in the drawings, such as the main controller 155 in FIG. 5, may be embodied as various numbers of hardware, software and/or firmware structures that execute respective functions described above, according to an exemplary embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Further, although a bus is not illustrated in the above block diagrams, communication between the components may be performed through the bus. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

In the above-described embodiments, the configuration and features of the inventive concept have been described based on the embodiments of the disclosure, but the embodiments of the present disclosure are not limited thereto. It is apparent to those skilled in the art that the present disclosure may be variously changed or modified without departing from the scope of the present disclosure. The scope of the disclosure is defined by the appended claims, and any modifications, substitutions, improvements and any equivalents thereof should be construed as falling within the scope of the disclosure.

The invention claimed is:

1. An aerosol-generating device comprising:
   a heating chamber configured to receive an aerosol-generating article;

a heater configured to heat the aerosol-generating article in the heating chamber;

an inductance sensor configured to measure an inductance value of a coil;

a capacitance sensor configured to measure a capacitance value of a capacitor; and a controller configured to detect whether the aerosol-generating article is inserted based on both the inductance value of the coil and the capacitance value of the capacitor being changed by a marker included in the aerosol-generating article, wherein the controller is further configured to detect that the aerosol-generating article is inserted into the heating chamber based on the inductance value being greater than or equal to a first reference value and the capacitance value being greater than or equal to a second reference value.

2. The aerosol-generating device of claim 1, wherein a detection range of the inductance sensor and a detection range of the capacitance sensor are set differently.

3. The aerosol-generating device of claim 2, wherein the detection range of the inductance sensor is set to be wider than the detection range of the capacitance sensor.

4. The aerosol-generating device of claim 1, wherein one side of the capacitance sensor faces the heating chamber, and the aerosol-generating device further comprises a shielding member placed on the other side opposite to the one side of the capacitance sensor.

5. The aerosol-generating device of claim 1, wherein the marker is placed on one side of the aerosol-generating article, the inductance sensor comprises a first inductance sensor and a second inductance sensor that are spaced apart from each other in one direction, and the second inductance sensor is positioned adjacent to the position of the marker of the aerosol-generating article inserted into the heating chamber.

6. The aerosol-generating device of claim 1, wherein the marker has a permeability changing the inductance of the coil and a permittivity changing the capacitance value of the capacitor.

7. The aerosol-generating device of claim 1, wherein the aerosol-generating device includes a sensor assembly including the coil, the capacitor, and a sensor controller configured to receive the inductance value from the coil and the capacitance value from the capacitor.

8. The aerosol-generating device of claim 7, wherein the controller comprises a main controller configured to operate in a sleep mode in which an operation of the heater is controlled to be deactivated and in an operation mode in which the operation of the heater is controlled to be activated, the sensor assembly wakes up the main controller from the sleep mode to the operation mode based on the inductance value, and the main controller detects whether the aerosol-generating article is inserted based on the capacitance value.

9. The aerosol-generating device of claim 1, wherein the aerosol-generating article is in a form of a cigarette extending in one direction, and the marker is placed at one end of the aerosol-generating article.

10. The aerosol-generating device of claim 1, wherein the aerosol-generating article is a cartridge including a liquid aerosol-generating material.

11. An operating method of an aerosol-generating device, the method comprising:

measuring an inductance value of a coil that changes according to a movement of an aerosol-generating article comprising a marker, by an inductance sensor including the coil, the inductance value being changed by the marker;

measuring a capacitance value of a capacitor that changes according to the movement of the aerosol-generating article comprising the marker, by a capacitance sensor including the capacitor, the capacitance value being changed by the marker;

detecting whether the aerosol-generating article is inserted into a heating chamber based on the inductance value being greater than or equal to a first reference value and the capacitance value being greater than or equal to a second reference value; and heating the aerosol-generating article inserted into the heating chamber using a heater.

12. An aerosol-generating system comprising:

an aerosol-generating article comprising an aerosol-generating material and a marker; and an aerosol-generating device comprising:

a heating chamber configured to receive the aerosol-generating article;

a heater configured to heat the aerosol-generating article in the heating chamber;

an inductance sensor configured to measure an inductance value of a coil;

a capacitance sensor configured to measure a capacitance value of a capacitor; and a controller configured to detect whether the aerosol-generating article is inserted based on both the inductance value of the coil and the capacitance value of the capacitor being changed by the marker, wherein the controller is further configured to detect that the aerosol-generating article is inserted into the heating chamber based on the inductance value being greater than or equal to a first reference value and the capacitance value being greater than or equal to a second reference value.

13. The aerosol-generating device of claim 1, wherein the inductance sensor is arranged at a first side of the heating chamber, wherein the capacitance sensor is arranged at a second side of the heating chamber opposite to the first side, and wherein the inductance sensor and the capacitance sensor are positioned such that a detection range of the inductance sensor and a detection range of the capacitance sensor overlap each other.

* * * * *